United States Patent
Jackson

[11] Patent Number: 6,047,744
[45] Date of Patent: *Apr. 11, 2000

[54] DELIVERY SYSTEM AND MANIFOLD

[75] Inventor: Robert M. Jackson, Burnet, Tex.

[73] Assignee: Advanced Delivery & Chemical Systems, Ltd., Austin, Tex.

[ * ] Notice: This patent is subject to a terminal disclaimer.

[21] Appl. No.: 09/327,842

[22] Filed: Jun. 8, 1999

Related U.S. Application Data

[63] Continuation of application No. 08/893,913, Jul. 11, 1997.

[51] Int. Cl.$^7$ .......................................................... B65B 1/16
[52] U.S. Cl. .................................... 141/21; 141/5; 141/7; 141/59; 141/65; 137/209
[58] Field of Search ..................... 141/18, 21, 5, 141/7, 59, 65, 67; 137/209, 240

[56] References Cited

U.S. PATENT DOCUMENTS 5,069,244  12/1991  Miyazaki et al. ........................ 137/209
5,562,132  10/1996  Siegele et al. ............................. 141/21

*Primary Examiner*—Steven O. Douglas
*Assistant Examiner*—Tuan Nguyen
*Attorney, Agent, or Firm*—O'Keefe, Egan & Peterman

[57] ABSTRACT

This invention concerns a manifold for use in refill of canister containing chemicals. The manifold may comprise a vacuum supply valve; a vacuum generator; a pressure vent valve; a gas inlet valve; a bypass valve; an isolation valve; a control valve; a canister inlet valve; a canister outlet valve; a canister inlet coupler, and a canister outlet coupler. In the manifold the vacuum supply valve may be connected to the vacuum generator; the vacuum generator may be connected to the pressure vent valve and the control valve; the gas inlet valve may be connected to pressure vent valve and bypass valve; the bypass valve may be further connected to the isolation valve and the canister inlet valve; the isolation valve may also be connected to the canister outlet valve. In addition, the canister inlet valve may be connected to control valve, the canister inlet coupler, and the canister outlet valve; and the canister outlet valve may be further connected to the canister inlet coupler and the canister outlet coupler.

16 Claims, 6 Drawing Sheets

DELIVERY SYSTEM AND MANIFOLD

This application is a continuation of application Ser. No. 08/893,913, filed Jul. 11, 1997.

BACKGROUND OF INVENTION

This invention generally pertains to a manifold used in a chemical delivery system.

The chemicals used in the fabrication of integrated circuits must have a ultrahigh purity to allow satisfactory process yields. As integrated circuits have decreased in size, there has been a directly proportional increase in the need for maintaining the purity of source chemicals. This is because contaminants are more likely to deleteriously affect the electrical properties of integrated circuits as line spacing and interlayer dielectric thickness decrease.

One ultrahigh purity chemical used in the fabrication of integrated circuits is tetraethylorthosilicate (TEOS). TEOS has been widely used in integrated circuit manufacturing operations such as chemical vapor deposition (CVD) to form silicon dioxide films. These conformal films are generated upon the molecular decomposition of TEOS at elevated temperatures in plasma enhanced and atmospheric pressure reactors (PECVD, APCVD). TEOS is typically used for undoped, and phosphorous and boron doped interlayer dielectrics, intermetal dielectrics, sidewall spacers, and trench filling applications.

Integrated circuit fabricators typically require TEOS with 99.999999+% purity with respect to trace metals. Overall, the TEOS must exhibit a 99.99+% purity. This high degree of purity is necessary to maintain satisfactory process yields. However, it also necessitates the use of special equipment to contain and deliver the high purity TEOS to the CVD reaction chamber.

Traditionally, high purity TEOS (and dopants) has been fed to the CVD reaction chamber from a small volume container called an ampule. More recently, stainless steel containers have been developed, such as described in U.S. Pat. Nos. 5,45,766; 5,562,132; and 5,607,002. The present inventors have discovered that the manifold system disclosed in these patents which was designed for materials of known physical properties and not acutely toxic were needed to be changed to accommodate other, more agressive chemicals. In addition, the present inventors have sought to improve on the fail safe nature of the system. The present inventors have thus determined that a need exists for an improved manifold for use in the refill systems such as described in the above-referenced patents.

SUMMARY OF INVENTION

This invention provides a solution to one or more of the needs, disadvantages, and shortcomings described above.

In one broad respect, this invention is a manifold for use in refill of canister containing chemicals, comprising: a vacuum supply valve; a vacuum generator; a pressure vent valve; a gas inlet valve; a bypass valve; an isolation valve; a control valve; a canister inlet valve; a canister outlet valve; a canister inlet coupler; and a canister outlet coupler; wherein the vacuum supply valve is connected to the vacuum generator; wherein the vacuum generator is connected to the pressure vent valve and the control valve; wherein the gas inlet valve is connected to pressure vent valve and bypass valve; wherein the bypass valve is further connected to isolation valve and the canister inlet valve; wherein the isolation valve is also connected to canister outlet valve; wherein canister inlet valve is connected to control valve, canister inlet coupler, and canister outlet valve; and wherein canister outlet valve is further connected to canister inlet coupler and canister outlet coupler.

In another broad respect, this invention is manifold useful for refillably connecting two canisters containing liquid chemicals, comprising: a vacuum supply valve connected to a vacuum generator; a pressure vent valve connected to the vacuum generator and to a gas inlet valve; a control valve connected to vacuum generator; wherein the gas inlet valve is also connected to a bypass valve, an isolation valve connected to a canister outlet valve and to the bypass valve, and a canister inlet valve connected to the bypass valve, the control valve, and a canister outlet valve.

In another broad respect, this invention is a method of connecting a canister to a manifold, comprising: connecting the fittings of a canister to the fittings of a manifold to thereby provide a delivery system; and purging the delivery system of air and water, wherein the manifold comprises a vacuum supply valve; a vacuum generator, a pressure vent valve; a gas inlet valve; a bypass valve; an isolation valve; a control valve; a canister inlet valve; a canister outlet valve; a canister inlet coupler; and a canister outlet coupler; wherein the vacuum supply valve is connected to the vacuum generator; wherein the vacuum generator is connected to the pressure vent valve and the control valve; wherein the gas inlet valve is connected to pressure vent valve and bypass valve; wherein the bypass valve is further connected to isolation valve and the canister inlet valve; wherein the isolation valve is also connected to canister outlet valve; wherein canister inlet valve is connected to control valve, canister inlet coupler, and canister outlet valve; and wherein canister outlet valve is further connected to canister inlet coupler and canister outlet coupler.

In yet another broad respect, this invention is a method of manufacturing a manifold, comprising: providing a vacuum supply valve, a vacuum generator, a pressure vent valve, a gas inlet valve, a bypass valve, an isolation valve, a control valve, a canister inlet valve, a canister outlet valve, a canister inlet coupler, and a canister outlet coupler; connected the valves with lines such that the vacuum supply valve is connected to the vacuum generator, the vacuum generator is connected to the pressure vent valve and the control valve, the gas inlet valve is connected to pressure vent valve and bypass valve, the bypass valve is further connected to isolation valve and the canister inlet valve, the isolation valve is also connected to canister outlet valve, the canister inlet valve is connected to control valve, canister inlet coupler, and canister outlet valve, and the canister outlet valve is further connected to canister inlet coupler and canister outlet coupler.

Advantageously, the manifold of this invention enables improved purge efficiency for low vapor pressure materials and toxic chemicals.

DETAILED DESCRIPTION OF THE INVENTION

A general description of the metallic canisters, chemical refill system, operating procedures, components, starting manifold system, and so forth, which may be used in the practice of this invention is set forth in U.S. Pat. Nos. 5,465,766; 5,562,132; and 5,607,002, the entire contents of which are incorporated by reference herein.

Figure 1:
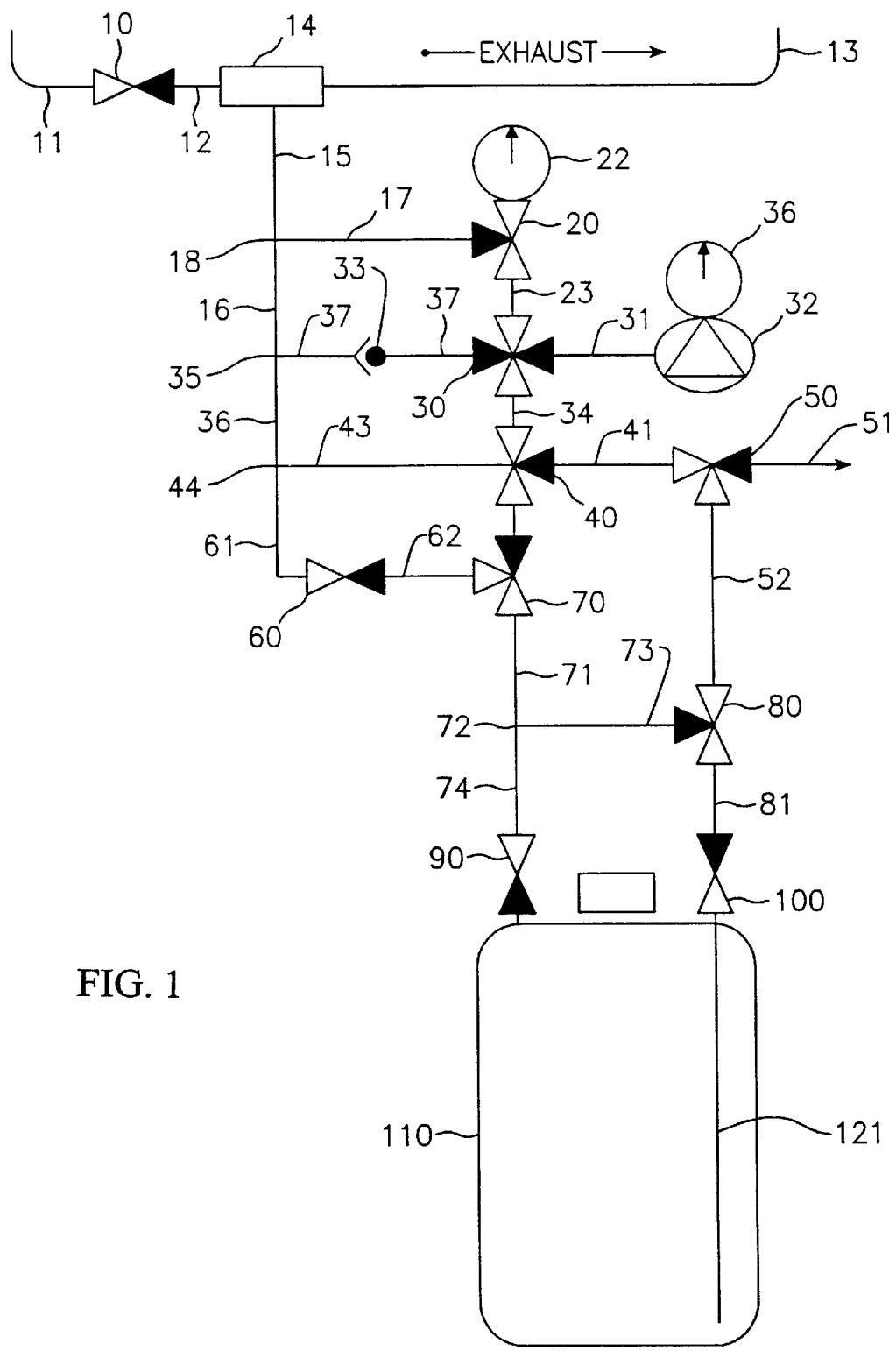
FIG. 1 depicts a representative manifold configuration of this invention.

In FIG. 1 there is shown a manifold system of this invention. In FIG. 1, a vacuum source 14 such as a Venturi vacuum generator may be connected to vacuum supply valve ("VGS") 10 via line 12. VGS 10 functions to control the flow of gas (such as nitrogen, helium, or argon) via inert gas line 11 to the vacuum source 14 if the vacuum source is a Venturi vacuum generator. Vacuum source 14 may also be attached to exhaust line 13 which exits to exhaust Vacuum source 14 may be connected to low pressure vent valve ("LPV") 20. carrier gas isolation valve ("CGI") 30, canister bypass valve ("CBV") 40, and control valve ("CP3") 60. For each of the valves in the FIGS., the open triangles represent lines which are always open, with the darkened triangles being closed until opened. In FIG. 1, vacuum source 14 is connected to LPV 20 via line 15, tee 18, and line 17; to CGI 30 via line 15, tee 18, line 16, tee 35, and line 37; to CBV 40 via line 15, tee 18, line 16, tee 35, line 36, tee 44, and line 61. Check valve 33 in line 37 is closed unless and until the manifold eclipses the desired release pressure. Hence, vacuum source 14 is typically closed off to CGI 30 via line 37. Generally, the check valve 33 may be set to activate if the manifold pressure surpasses about 100 pounds per square inch. The check valve serves to vent gas if pressure in the system reaches a selected level. The function of LPV 20 is to control venting and evacuation of manifold and canister during start-up and canister change-out. Vacuum gauge 22 may also be connected to LPV 20. Vacuum gauge 22 may function to monitor vacuum during purge cycles. Line 23 may connect LPV 20 to carrier gas isolation valve ("CGI") 30. Line 31 may connect CGI 30 to regulator 32 which may supply a flow of pressurized inert gas. A delivery pressure gauge 36 may be tied into regulator 32 to monitor regulator pressure and pressure during all operations.

In FIG. 1, line 34 may connect CGI 30 to CBV 40. Line 41 and 42 may attach CBV 40 to process line isolation valve ("PLI") 50 and to control valve ("CP2") 70. The function of PLI 50 is to control the flow of chemical out of the manifold. CGI 30 functions to control the pressurized gas supply to the manifold. The function of CBV 40 is to control the supply of pressure or vacuum to PLI 50 and to line 71. Line 51 may carry chemicals to either a device outside the system, or to another canister to be refilled. Line 52 may serve to link PLI 50 to control valve ("CP1") 80. Line 62 may connect control valve 60 to control valve 70. From control valve 70, line 71 may lead to tee fitting 72, with lines 73 and 74 running from tee 72 to control valve 80 and canister inlet ("CI") 90, respectively. CI 90 functions to control pressurization and evacuation of a canister. Control valve 80 may link to canister outlet ("CO") 100 via line 81. CO 100 functions to control the flow of chemical from a canister 110 during chemical delivery and the purging of the canister outlet weldment during canister changes. CI 90 and CO 100 serve to couple the manifold to the corresponding structures on a supply canister, such as male and female threaded joints. Fittings to join the manifold to canister 110 are typically present between CI 90 and tee 72, and between CO 100 and CPI 80. If CO 100 is a dual activator valve, tee 72 can be shifted down to directly connect with CI 90, such that a line connects the dual activator directly to CI 90.

Canisters 110 may be loaded with a variety of chemicals, and are typically burdened with high purity chemicals for use in semiconductor manufacture. For example, the canisters may contain TEOS, arsenic compounds, titanium compounds, boron compounds, and so forth. In one embodiment of this invention, the canister 110 is at least partially filled with a chemical which is at least 99.9999% pure based on the amount of trace metals in the chemical.

The aforementioned lines, which may also be referred to as conduits, tubing, pipes, passages, and the like, may be constructed of metal tubing, for example, such as stainless steel tubing. Each of the valves may be conventional pneumatically actuated valves, such as a NUPRO 6L-M2D-111-P-III gas control valve. Likewise, the regulator can be a standard type, such as an AP Tech 1806S 3PW F4—F4 V3 regulator. The system may be assembled using conventional methods, such as by using pressure fitting valves, by welding, and the like. The valves may be controlled using conventional process control such as an Omron programmable controller box wired to a touch screen control panel. Alternatively, the valves may be controlled using an ADCS APC™ Controller which incorporates an imbedded microprocessor for command sequence execution, with software residing on an EPROM. The control unit, for example, may control flow of pressurized gas to open or close pneumatic valves.

Figure 2:
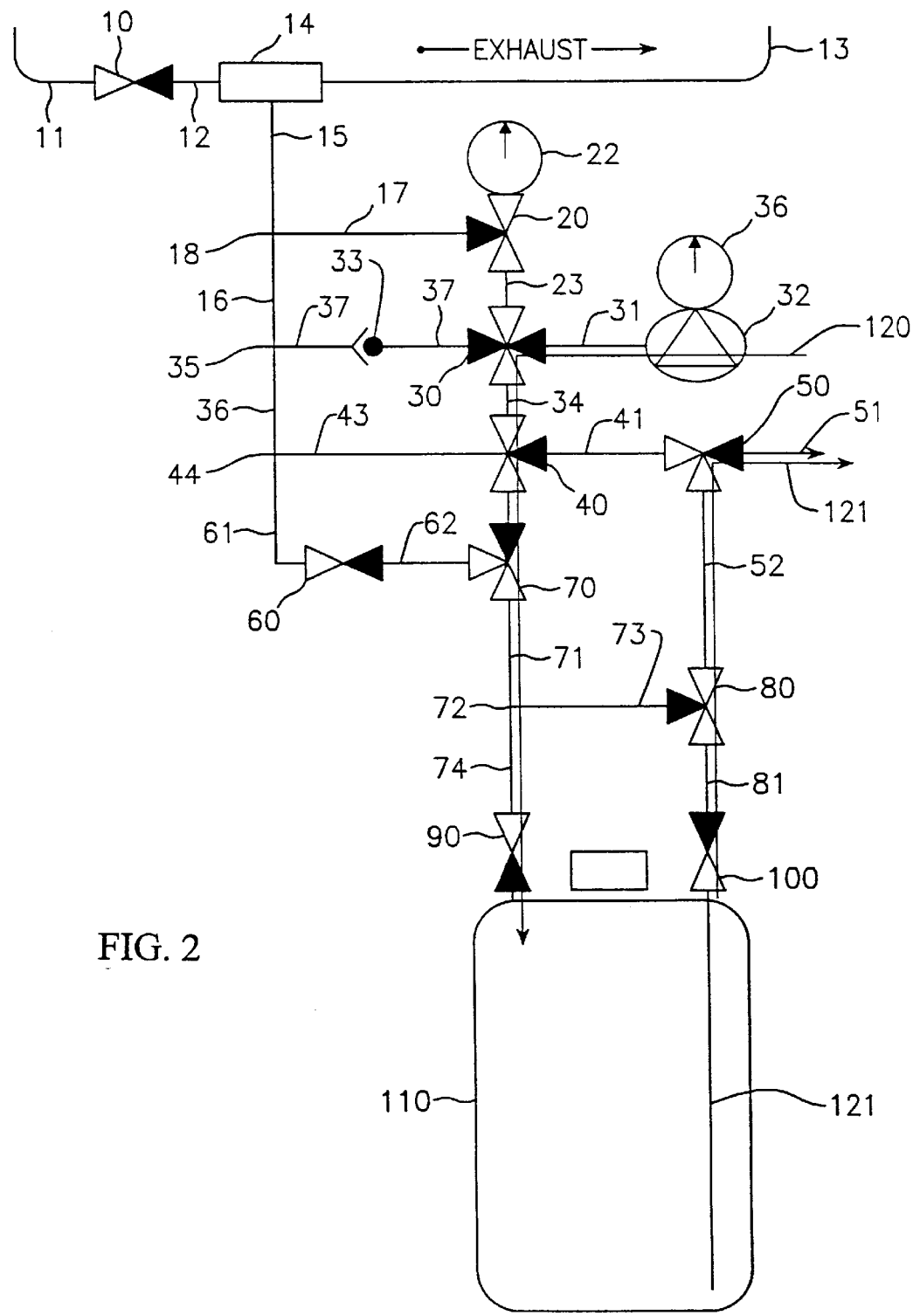
FIG. 2 depicts the path of gas in the manifold while a canister is in service.

During use, the manifold of this invention may be operated as follows. To push chemical out of the canister 110 to the delivery point, the valves in the manifold are appropriately opened and closed to all pressurized gas into the system and into the canister. In FIG. 2, line 120 illustrates the path of pressurized gas entering canister 110, with line 121 showing the path of liquid chemical exiting canister 110 through a dip tube 121. Thus, pressurized gas from a source (not shown) is released by regulator 32 into line 31. The gas thereafter passes through open CGI 30, then through line 34, CBV 40, line 71, CI 90, and into canister 110. Pressure from entering gas forces liquid chemical up the dip tube, and through CO 100, line 81, CP1 80, line 52, PLI 50, and out line 51 to the receiving point.

Figure 3:
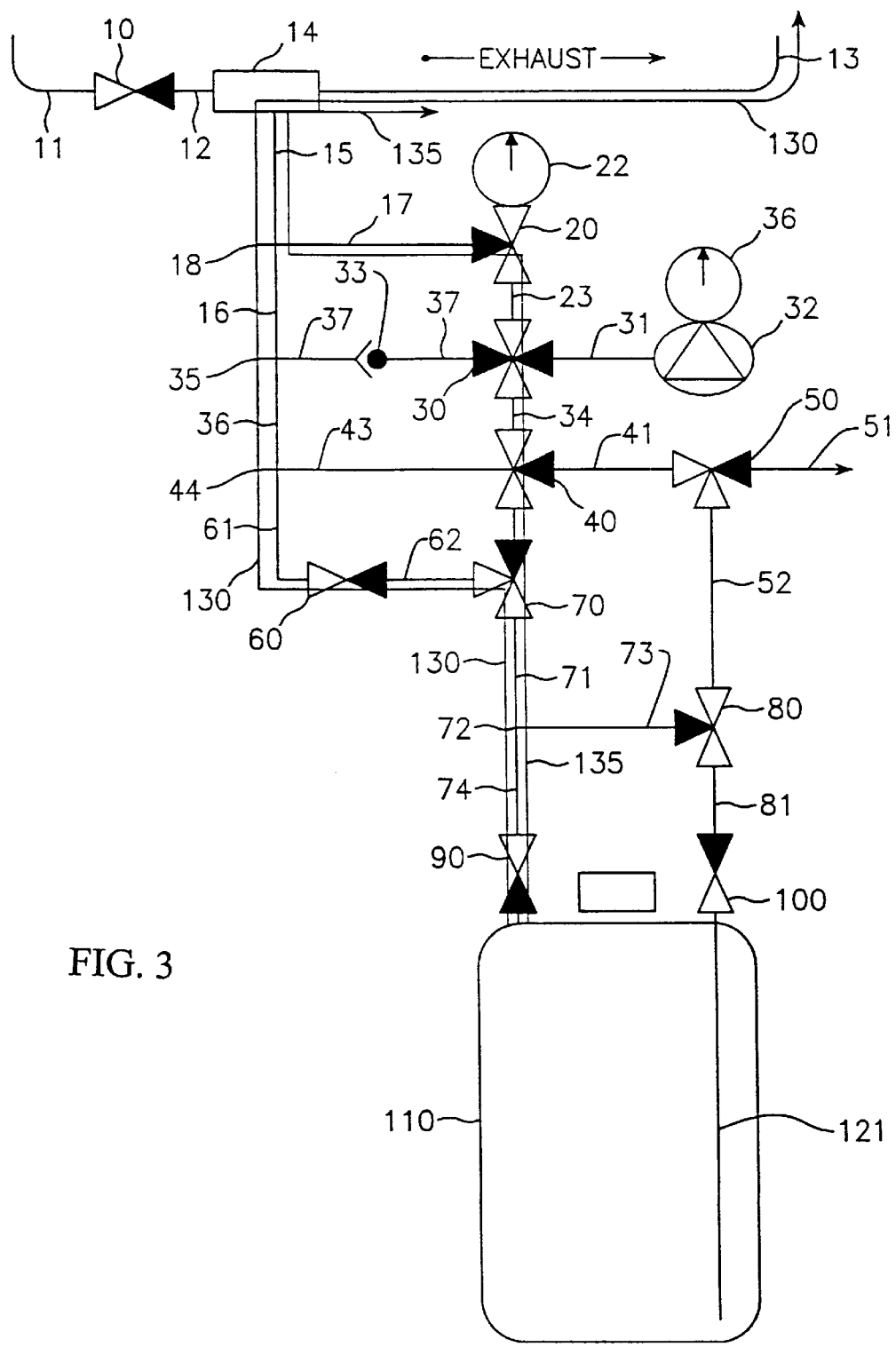
FIG. 3 depicts the path of flow in the manifold during a depressurization step to remove the head pressure in the canister.

When a supply canister (even a fill canister) is being changed out, the lines may be purged to rid the manifold of residual chemicals. The first step is depressurization, which functions to remove the head pressure in canister 110. Depressurization may be affected in a few ways. For example, two procedures by which depressurization may occur are depicted in FIG. 3. In one depressurization method, depicted by solid line 130, VGS 10 is opened to allow gas to flow from line 11 through line 12 and into vacuum source 14 such that a vacuum is generated with the flow exiting via line 13 to exhaust. The vacuum which is generated in source 14 pulls a vacuum on line 15, tee 18, line 16, tee 35, line 36, tee 44, line 61, through open CPI 60, line 62, CP2 70, line 71, tee 72, line 74, and open CI 90, thereby pulling a vacuum on the head space of canister 110. Alternatively, depressurization can be affected by opening LPV 20, CP2, and CI 90 so that the vacuum is pulled via solid line 135.

Figure 4:
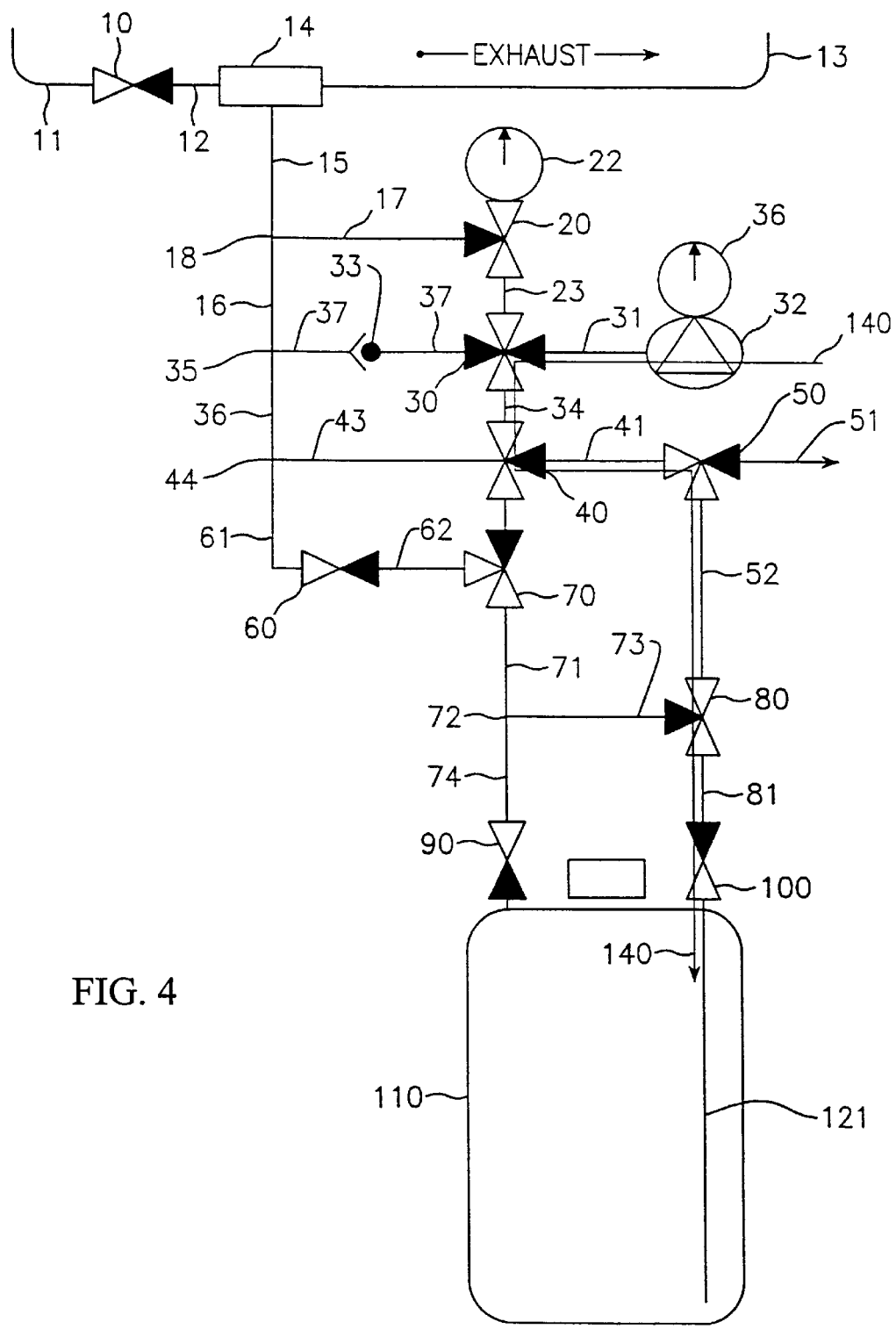
FIG. 4 depicts the flow of gas in the manifold during a liquid drain

After depressurization, a liquid drain instituted to clear the lines (weldments) of liquid. Thus, in FIG. 4 gas is introduced via regulator 32 into line 31. CGI 30, CBV 40, and CO 100 are open such that gas flows through lines 34, 41, 52, and 81 such that liquid chemical is forced back into canister 110. The flow of gas during the line drain is illustrated by solid line 140.

Figure 5:
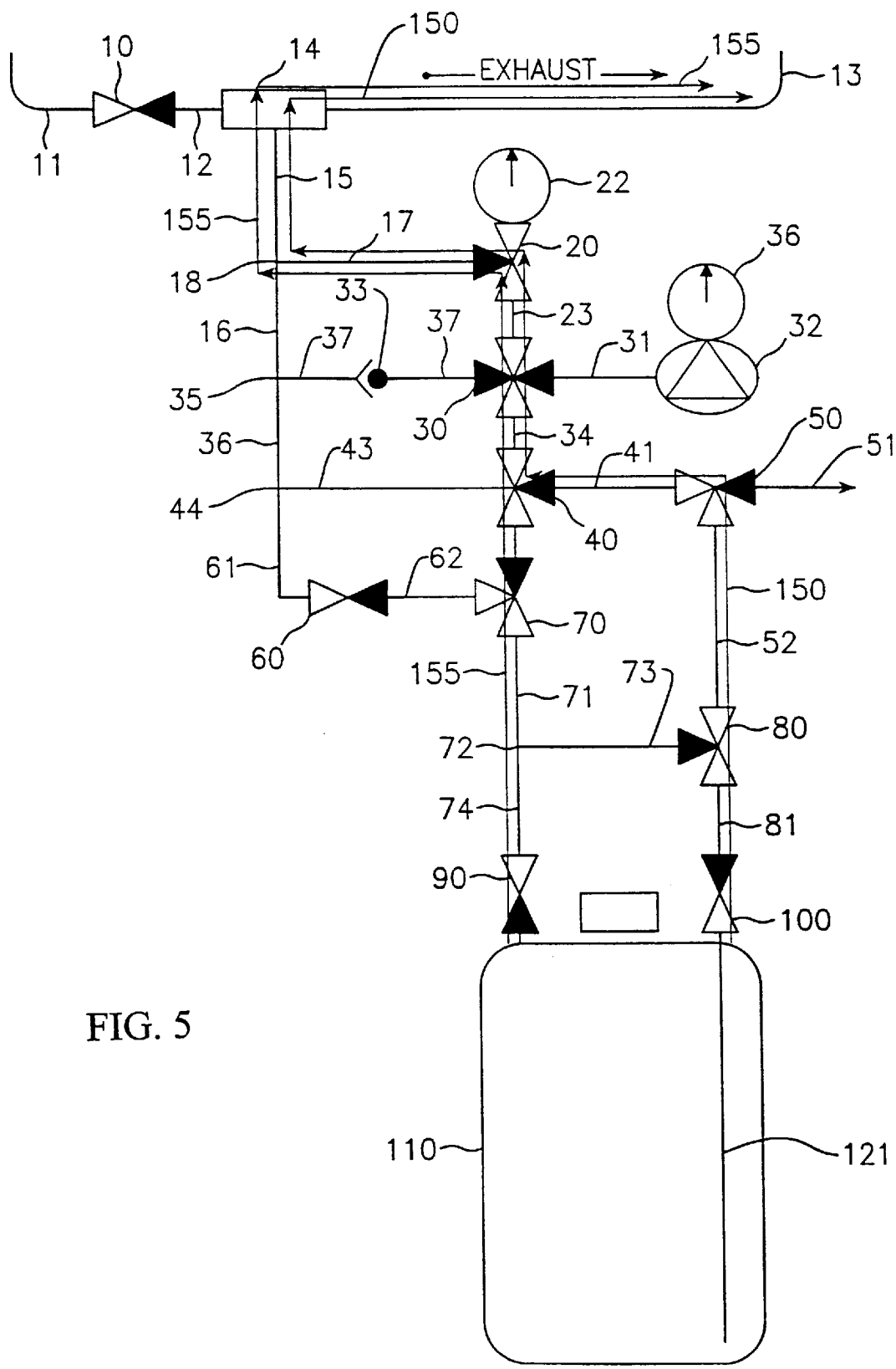
FIG. 5 depicts the flow of gas in the manifold during a cycle purge.
Figure 6:
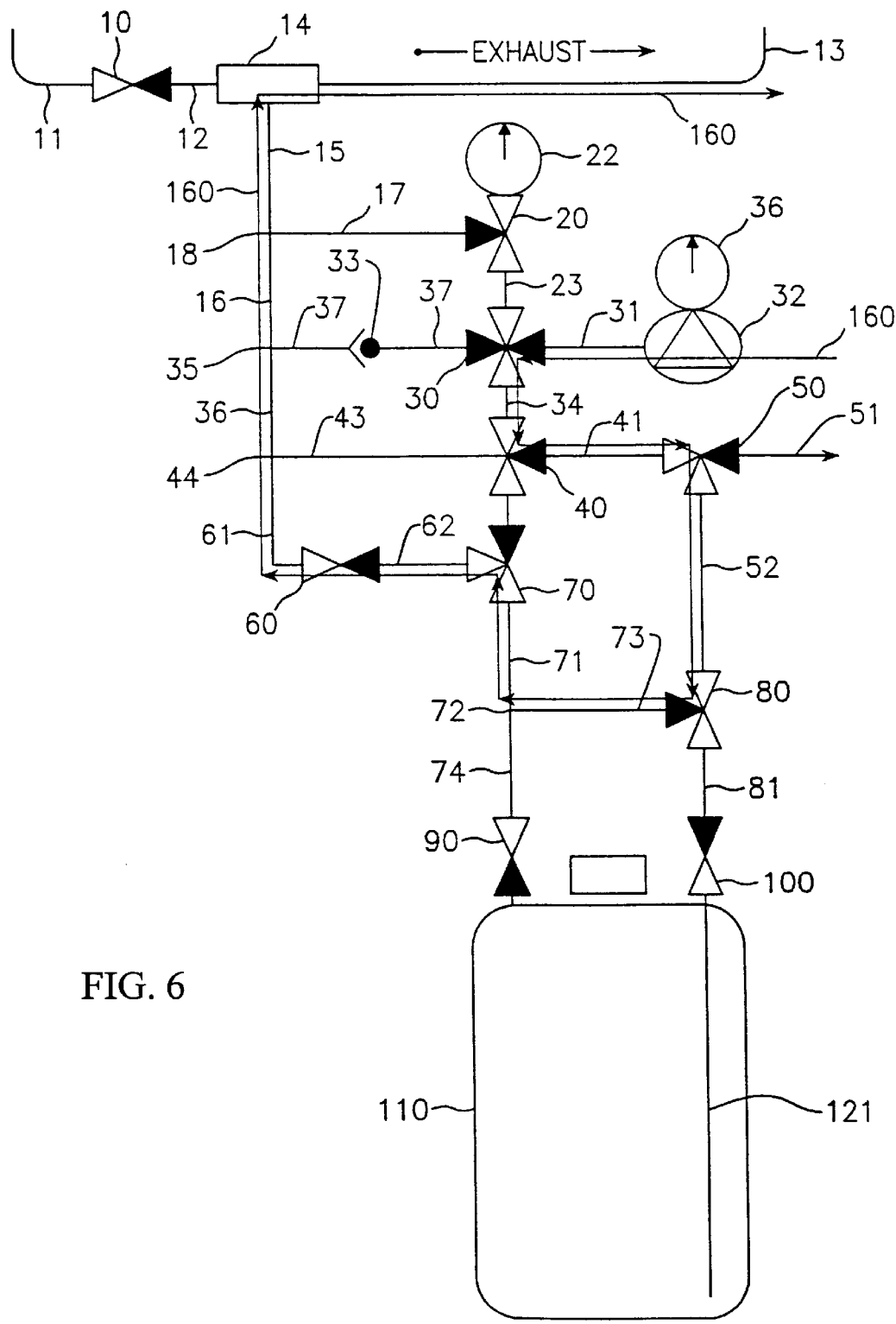
FIG. 6 depicts a flowing purge in the manifold during a cycle purge.

Thereafter, a cycle purge is instituted which includes a vacuum step and a flowing purge step as illustrated in FIGS. 5 and 6, respectively. The vacuum step may be accomplished in a variety of ways, including via the configurations depicted by solid lines 150 and 155 in FIG. 5. Thus, in one embodiment, CBV 40 and LPV 20 is open such that when VGS 10 is opened to allow gas into vacuum source 14 via lines 11 and 12, a vacuum is drawn out to exhaust via line 13, with a vacuum thus being pulled on lines 15, 17, 23, 34, 41, 52, and 81. Alternatively, LPV 20 and CP2 70 are open such that a vacuum is pulled on lines 15, 17, 23, 34, 42, 71 and 74. In addition, LPV 20, CP2 70 and CBV 40 can all be open such that a vacuum is pulled on lines 42, 71, and 74 as well as on lines 41, 52, and 81. The openings can be alternated so that lines 42/71/74 and 41/52/81 are intermittently evacuated.

In FIG. 6, a flowing purge of the cycle purge is illustrated. In FIG. 6, regulator 32 allows pressurized gas to enter line 31. With CGI 30, CBV 40, CP1 80, and CP3 60 open (note CI 90 and CO 100 are closed), the gas flows through lines 34, 41, 52, 73, 71, 62, 61, 36, 16, 15, and 13 to thereby purge the manifold, as depicted in FIG. 6 by solid line 160. LPV 20 may be intermittently opened so that lines 23 and 17 may be purged. After purge, the fittings are typically broken while a positive pressure on the manifold is maintained so that moisture does not enter the manifold. For instance, CGI 30, CBV 40, and CP2 70 may be opened so that gas flows out lines 74 and 81 after the fittings are broken. After a new canister is seated, the purge cycle is typically repeated to remove any water or other contaminant that might have entered the manifold, as well as any water in the fittings and weldments of the new canister.

Two manifolds of this invention may be interconnected, such as by connecting two manifolds through a vacuum supply valve.

What is claimed is:

1. A method useful for providing a chemical for use in semiconductor manufacture from a manifold to a device, comprising:

connecting the fittings of a canister to the fittings of a manifold to thereby provide a delivery system, wherein the manifold comprises a vacuum supply valve;

a vacuum generator;

a pressure vent valve;

a gas inlet valve;

a canister bypass valve;

a process line isolation valve;

a control valve;

a canister inlet valve;

a canister outlet valve;

a second control valve; and a third control valve;

wherein the vacuum supply valve is connected to the vacuum generator; wherein the vacuum generator is connected to the pressure vent valve and the control valve; wherein the control valve connects to the second control valve; wherein the gas inlet valve is connected to the pressure vent valve and the bypass valve; wherein the bypass valve is further connected to the isolation valve and the second control valve; wherein the isolation valve is also connected the third control valve; wherein canister inlet valve is connected to the second control valve and the third control valve; and wherein canister outlet valve is further connected to the third control valve; wherein a dip tube in the canister connects to the canister outlet valve; wherein a line connects the process line isolation valve to the device; wherein the valves are connected by lines;

introducing a pressurized gas into the canister through the canister inlet valve so that pressure in the canister causes a flow of chemical to exit the canister through the dip tube and through the canister outlet valve, the third control valve, the process line isolation valve and the line to the device.

2. The process of claim 1 wherein the valves are pneumatically actuated.

3. The process of claim 1 wherein the lines are stainless steel tubing, and the valves are stainless steel.

4. The process of claim 1 wherein gas inlet valve is further connected to an inert gas source.

5. The process of claim 1 wherein the canister inlet coupler and canister outlet coupler are pneumatically actuated valves.

6. The process of claim 1 wherein the vacuum generator is a Venturi vacuum generator.

7. The process of claim 1 wherein the manifold includes a first tee fitting connecting the pressure vent valve, the vacuum generator and the control valve.

8. The process of claim 1 wherein the third control valve and the canister outlet valve together form a dual activator valve.

9. The process of claim 1 further comprising replacing the canister with a second canister by depressurizing the canister, draining the chemical present in the manifold back into the canister, pulling a vacuum on the manifold, introducing gas into the manifold to provide a flowing purge of gas through the gas inlet valve, the canister bypass valve, the process line isolation valve, the third control valve, the second control valve and the first control valve; unconnecting the fittings of the canister and the fittings of the manifold; and connecting the fittings of the second canister to the fittings of the manifold.

10. The process of claim 9 wherein the valves are pneumatically actuated.

11. The process of claim 9 wherein the lines are stainless steel tubing, and the valves are stainless steel.

12. The process of claim 9 wherein gas inlet valve is further connected to an inert gas source.

13. The process of claim 9 wherein the canister inlet coupler and canister outlet coupler are pneumatically actuated valves.

14. The process of claim 9 wherein the vacuum generator is a Venturi vacuum generator.

15. The process of claim 9 wherein the manifold includes a first tee fitting connecting the pressure vent valve, the vacuum generator and the control valve.

16. The process of claim 9 wherein the third control valve and the canister outlet valve together form a dual activator valve.

* * * * *